(12) United States Patent
Shima

(10) Patent No.: US 7,016,012 B2
(45) Date of Patent: Mar. 21, 2006

(54) EXPOSURE APPARATUS

(75) Inventor: Shinichi Shima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 162 days.

(21) Appl. No.: 10/725,062

(22) Filed: Dec. 2, 2003

(65) Prior Publication Data

US 2004/0109148 A1 Jun. 10, 2004

(30) Foreign Application Priority Data

Dec. 5, 2002 (JP) .............................. 2002-353890

(51) Int. Cl.
G03B 27/42 (2006.01)
G03B 27/54 (2006.01)
G03B 27/68 (2006.01)

(52) U.S. Cl. .............................. 355/52; 355/53; 355/67
(58) Field of Classification Search ................. 355/52, 355/53, 67, 77
See application file for complete search history.

(56) References Cited

U.S. PATENT DOCUMENTS

| 5,751,404 | A | 5/1998 | Murakami et al. | 355/53 |
| 6,268,903 | B1 | 7/2001 | Chiba et al. | 355/53 |
| 6,377,333 | B1 | 4/2002 | Chiba et al. | 355/53 |
| 6,522,386 | B1 | 2/2003 | Nishi | 355/52 |
| 2002/0057424 | A1 | 5/2002 | Shima | 355/53 |
| 2002/0113953 | A1 | 8/2002 | Chiba | 355/52 |
| 2003/0128344 | A1 | 7/2003 | Nishi | 355/52 |
| 2003/0133087 | A1 | 7/2003 | Shima | 355/53 |
| 2003/0174297 | A1 | 9/2003 | Chiba et al. | 355/52 |

FOREIGN PATENT DOCUMENTS

| JP | 8-203805 | 8/1996 |
| JP | 8-262747 | 10/1996 |
| JP | 10-27738 | 1/1998 |
| JP | 10-228099 | 8/1998 |
| JP | 11-45842 | 2/1999 |
| JP | 2001-305719 | 11/2001 |

Primary Examiner—Rodney Fuller
(74) Attorney, Agent, or Firm—Fitzpatrick, Cella, Harper & Scinto

(57) ABSTRACT

An exposure apparatus according to this invention includes a projection optical system having a predetermined image forming characteristic; a reticle stage, arranged on one side of the projection optical system, and which holds a reticle having a transfer pattern and has a reference plate for positioning; and a wafer stage, arranged on the other side of the projection optical system, and which holds a wafer where the transfer pattern is transferred and has a reference mark. For transferring the transfer pattern to the wafer, a reticle protection pellicle and an optical device are arranged between the reticle and the projection optical system. For performing positioning using the reference plate and the reference mark, a correction optical device is arranged between the reference plate and the projection optical system. The correction optical device has a thickness equal to the total thickness of the optical device and pellicle.

10 Claims, 12 Drawing Sheets

EXPOSURE APPARATUS

FIELD OF THE INVENTION

The present invention relates to an exposure apparatus which exposes a pattern formed on an original plate to a photosensitive substrate through a projection optical system. Particularly, the present invention relates to an exposure apparatus employed in a lithography process of the exposure apparatus for manufacturing circuit devices, e.g., semiconductor circuit devices, liquid crystal display devices or the like.

BACKGROUND OF THE INVENTION

Generally, when semiconductor devices, liquid crystal display devices, magnetic thin-film heads and the like are manufactured in a photolithography process, a projection exposure apparatus (hereinafter referred to as an exposure apparatus) is employed. A projection exposure apparatus transfers a pattern formed on a photomask or a reticle (hereinafter referred to as a reticle) to a photosensitive substrate wafer or a glass plate (hereinafter referred to as a wafer). Recently, patterns of semiconductor devices or the like are increasingly downsized to micropatterns. To realize such downsizing, it is necessary for an exposure apparatus to improve alignment precision. Among various deterioration factors of alignment precision, particularly distortion in a pattern image needs to be reduced.

To reduce distortion, naturally it is necessary to reduce aberrations in a projection optical system. To achieve this, a projection optical system employed in a conventional exposure apparatus is designed to satisfy conditions such that an average of aberrations and distortions becomes small in the entire projection field of view. To bring aberrations and distortions within a designed allowable range, lens devices and optical members are processed with high precision, then aberrations are actually measured, and complicated cumbersome processes of assembly, adjustment, and inspections, e.g., adjustment of air space between lenses, a gradient of a lens, parallel eccentricity of a lens, and the like, are repeatedly performed for constructing a projection optical system.

Among various aberrations, symmetrical components of the distortions with respect to the optical axis or regular asymmetrical components are adjustable by the aforementioned adjusting methods. However, random components of distortions cannot be adjusted by the aforementioned adjusting methods. In view of this, for instance, Japanese Patent Application Laid-Open No. 8-203805 discloses a technique for reducing some of the difficulties involving manufacturing of such highly precise projection optical system, and for bringing the random components of distortions within a designed allowable range. According to this technique, an optical correction plate is inserted in a projection optical path. More specifically, an image distortion characteristic of a projection optical system assembled is actually measured, and the optical correction plate is polished to partially deflect the chief ray passing through respective points of the projection field of view so that the actually measured image distortion characteristic is minimized at respective points of the projection field of view.

While the aforementioned document (No. 8-203805) discloses a correction method related to a stepper employing an optical correction plate, Japanese Patent Application Laid-Open No. 11-045842 discloses a correction method employing an optical correction plate in a scanning projection exposure apparatus. The document (No. 11-045842) is directed to the fact that, when a pattern on a mask is exposed to a photosensitive substrate by a scanning projection exposure apparatus, an image distortion characteristic that is static with respect to the scanning direction throughout the projection area is averaged and becomes dynamic. Among the dynamic image distortion characteristic, at least random components are corrected by providing an image distortion correction plate in a projection optical path, i.e., a transparent plane parallel plate (optical correction plate) whose surface is locally polished.

In semiconductor device manufacturing processes, there are cases in which a pellicle is provided on one of or both surfaces of a reticle in order to prevent the transfer of a pattern on a reticle from being performed with attachment of foreign substances, such as dust, to the reticle or prevent such foreign substances from being transferred to a wafer.

The pellicle is configured with pellicle film (light transmissive dustproof film) which is held away from the reticle surface by a predetermined distance by a holding frame, e.g., aluminum. Therefore, when a wiring pattern formed on a pattern surface of the reticle is to be transferred to a wafer, even if a foreign substance is attached to the pellicle film, the foreign substance, e.g., dust, will not be transferred to the wafer because the reticle pattern surface and the pellicle film surface have different image-formation focusing distances. Therefore, by virtue of covering the reticle pattern surface with a pellicle, it is possible to prevent invasion of foreign substances, and improve a yield ratio in the semiconductor device production.

It is required for the pellicle film, employed as a pellicle, to have a sufficient film strength, light resistance, and light transmissibility in the wavelength of an exposure light source. As a pellicle film material for the conventional light, such as γ ray (436 nm), i ray (365 nm) or the like, cellulosic materials, e.g., cellulose nitrate, cellulose propionate or the like, are mainly employed.

Meanwhile, in the semiconductor device manufacturing processes, the trend is proceeding to shorten the wavelength of an exposure light source in order to improve the degree of integration accompanied by downsizing of micropatterns. To be more specific, currently a manufacturing process using a KrF excimer laser (wavelength of 248 nm) as an exposure light source is achieved. A manufacturing process using an ArF excimer laser (wavelength of 193 nm) as an actual exposure light source is in a process of being achieved as well. Also, utilizing ultraviolet rays having a shorter wavelength is under study. In particular, an $F_2$ laser (wavelength of 157 nm) is regarded as most promising.

As a pellicle film material which is durable to such light sources having a short wavelength, a fluororesin having a relatively low absorptivity in a short-wavelength ultraviolet area is known. As an example, CYTOP (trademark of Asahi Glass Co., Ltd.) or Teflon AF (trademark of DuPont) may be given.

These fluororesins have excellent light transmissibility and light resistance when a KrF excimer laser or an ArF excimer laser is used as an exposure light source. However, when an $F_2$ laser is used as an exposure light source, the resins cannot achieve sufficient light transmissibility. In addition, these resins are easily deteriorated by laser irradiation, and cannot be actually used as a pellicle. In view of this, Japanese Patent Application Laid-Open No. 2001-305719 discloses a pellicle having a high light transmissibility in the wavelength of 157 nm, and having excellent light resistance and film strength, which can be used when an $F_2$ laser is used as an exposure light source. This pellicle is characterized by employing as a pellicle film a synthetic quartz glass plate, having the hydroxyl content of 20 ppm or less. According to this document (No. 2001-305719), keeping the hydroxyl content to 20 ppm or less, preferably 10 ppm or less, can control variations of transmissivity to 1% or less.

Japanese Patent Application Laid-Open No. 10-228099 proposes another example. The document (No. 10-228099) discloses a pellicle and a pellicle case, having excellent light resistance, for ultraviolet rays having a wavelength of 200 nm or less. The pellicle and pellicle case are controlled so that irradiation of ultraviolet rays do not cause the components produced from an adhesion layer, which is generated for fixing the pellicle film to the pellicle holding frame, to become an aromatic compound, ketone, or a nitrogen compound. As a film material, the document proposes to use polytetrafluoro-ethylene (PTFE), a fluorocarbon resin such as a tetrafluoroethylene-hexafluoropropylene copolymer (FEP), a silicon polymer such as dimethyl polysiloxane, a fluorosilicon polymer and the like. Furthermore, commercially available fluorocarbon resins, such as CYTOP (trademark), Teflon AF (trademark) or the like, can be used.

Meanwhile, Japanese Patent Application Laid-Open No. 10-27738 discloses a calibration method of a scanning projection exposure apparatus. According to the document (No. 10-27738), a mask reference plate is arranged on a mask stage, a mark on the mask reference plate and a mark on a wafer reference plate on a wafer stage are detected by a microscope, and relative positions are measured. This configuration enables positioning of a mask and a wafer without a reference mask.

In a projection optical system of an exposure apparatus, it is desirable that both the reticle side (object side) and wafer side (image side) have a telecentric system. However, since it is difficult to completely remove a spherical aberration from the pupil of the projection optical system, there is a problem in that an angle between the wafer and the chief ray of an illumination light flux used at the time of examining the wafer mark is deviated from a vertical line. Assuming that an alignment mark on a wafer surface is to be examined through the projection optical system, if the alignment mark is examined only at a particular position (image height) on the optical axis of the projection optical system, the optical system is set so that the chief ray of the illumination light becomes vertical to the wafer surface at the image height. However, there are cases that the measuring image height must be moved because of the mark arrangement on the reticle or reference plate at the time of performing base line measurement for off-axis alignment, or that the examining image height must be changed for performing TTL on-axis alignment. In such case, if a spherical aberration remains on the pupil of the projection optical system, the angle between the wafer and the chief ray of the illumination light flux becomes deviated from a vertical line. When an incident angle of the examination light onto the wafer inclines, if the light is defocused to the + side or the − side, the alignment mark position measurement values will be deviated in correspondence with the inclination of the incident angle.

To solve this problem, the Applicant of the present invention proposes a method disclosed in Japanese Patent Application Laid-Open No. 8-262747. The document (No. 8-262747) is characterized by having a correction optical system for adjusting an optical path of a chief ray of examination light.

The conventional technique of adjusting an aberration characteristic by rotating a lens device serving as a part of the projection optical system or adding eccentricity or gradient with respect to the optical axis does not always ensure an excellent aberration characteristic (image distortion characteristic). Furthermore, in such adjusting technique, it is difficult to ensure stable precision. Moreover, the adjusting operation accompanies cumbersome trial-and-error elements which are problematic. The foremost problem of this technique is that although the technique enables uniform adjustment and correction on the overall image distortion characteristic in the effective projection area of the projection optical system, it cannot partially adjust or correct a local image distortion characteristic in the effective projection area.

In view of this, with respect to a scanning projection exposure apparatus, an optical correction plate is produced by the method disclosed in Japanese Patent Application Laid-Open No. 11-045842 and inserted in a projection optical path. It is predicted that inserting the optical correction plate enables easy correction of the local image distortion characteristic in the effective projection area.

In exposure light having a short wavelength, particularly in a laser having a wavelength of 200 nm or less, e.g., an $F_2$ laser (wavelength of 157 nm), it has been found that the conventional pellicle film materials cannot be used. However, by utilizing a synthetic quartz glass plate as disclosed in Japanese Patent Application Laid-Open No. 2001-305719, it is possible to provide a pellicle having a high light transmissibility, excellent light resistance and film strength even if an $F_2$ laser is used as an exposure light source. Moreover, Japanese Patent Application Laid-Open No. 10-228099 discloses a pellicle film material and a pellicle case, having excellent light resistance, for ultraviolet rays having a wavelength of 200 nm or less.

As described above, in a case where exposure light adopts an ArF laser or an $F_2$ laser having a short wavelength, the use of a synthetic quartz glass material as a pellicle material is expected to increase, in addition to the use of conventional film materials. As disclosed in Japanese Patent Application Laid-Open No. 2001-305719, the thickness of a synthetic quartz glass material is larger than the conventional film material. Therefore, an exposure apparatus employing an ArF laser or an $F_2$ laser as a light source must be compatible to both a reticle using a conventional film material as a pellicle and a reticle using a synthetic quartz glass material as a pellicle.

However, the film material and glass plate material have different thicknesses. Therefore, if an exposure apparatus which is supposed to employ a film material performs exposure with a reticle using a glass material as a pellicle, a pattern image of the reticle is transferred to a wafer with a focus deviation that corresponds to the thickness of the glass material (strictly speaking, corresponds to an increase in an optical path length caused by a refractive index of the glass material).

Furthermore, in employing a glass plate material, if the thickness of the glass plate material is not uniform on the entire surface, but is partially different or different among reticles (pellicles), similar consequences will result.

Meanwhile, in a scanning projection exposure apparatus, as disclosed in Japanese Patent Application Laid-Open No. 10-27738, a reticle (mask) reference plate is arranged on a reticle stage, a mark on the reticle reference plate and a mark on a wafer reference plate on a wafer stage are detected by a microscope, and relative positions are measured. Therefore, positioning of a mask and a wafer can be realized without a reference mask. However, if a correction plate proposed by Japanese Patent Application Laid-Open No. 11-045842 is employed, the existence or absence of the correction plate at the time of examining the reticle (mask)

reference plate will cause a difference in the focus, ultimately deteriorating the measuring precision. Furthermore, changes in the pellicle thickness will also cause a similar problem.

Furthermore, even if a spherical aberration remains on the pupil of the projection optical system, it is possible to solve the problem by the method disclosed in Japanese Patent Application Laid-Open No. 8-262747 which proposes a correction optical system for adjusting an optical path of a chief ray of examination light. However, along with the improved precision, higher adjustment precision is required. As a result, the size of the adjustment mechanism is enlarged.

In view of the above problems, it is expected to develop an optical device which can correct influences of the surface shape of a reticle pattern, which is a distortion factor, and a random distortion that remains in the projection optical system, as well as a pellicle which is not easily deteriorated by a light source using lasers having a short wavelength, such as an ArF laser or an $F_2$ laser.

SUMMARY OF THE INVENTION

The present invention has been proposed to solve the conventional problems, and has as its object to provide an exposure apparatus comprising:
a projection optical system having a predetermined image forming characteristic;
a mask stage, arranged on one side of the projection optical system, for holding a mask substrate and having a reference plate;
a wafer stage, arranged on the other side of the projection optical system, for holding a wafer and having a reference mark;
an optical modulation member for influencing an image forming relation between the mask substrate and the wafer, when the pattern on the mask substrate is transferred to the wafer through the projection optical system; and
an adjusting unit for substantially matching an image forming relation between the reference plate and the reference mark to the image forming relation between the mask substrate and the wafer, which has been influenced by the optical modulation member, when positions of the reference plate and the reference mark are detected through an optical path of the projection optical system for positioning the mask substrate and the wafer.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

FIRST EMBODIMENT

Figure 1:
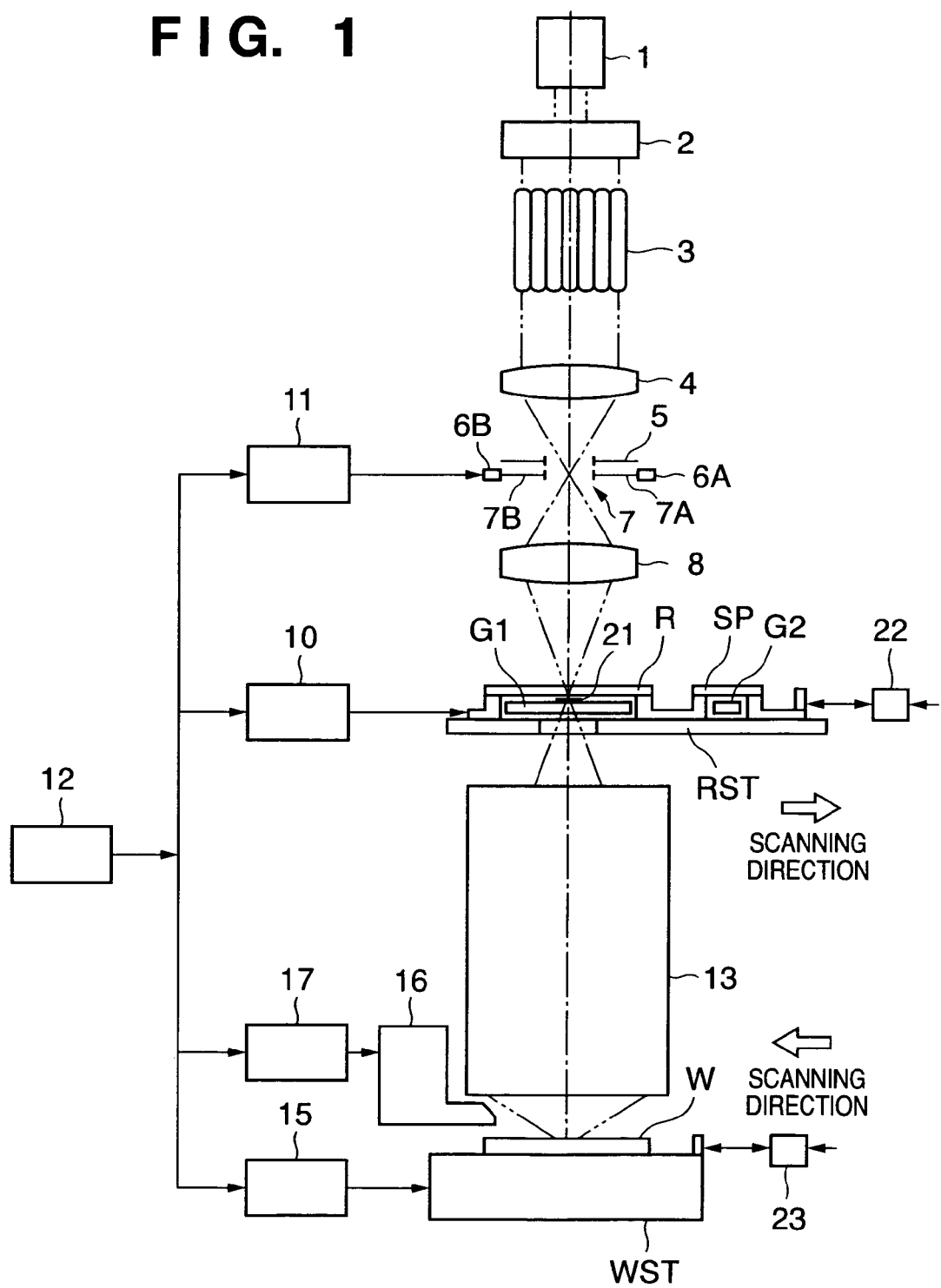
FIG. 1 is a diagram explaining an exposure apparatus according to the first embodiment of the present invention.

FIG. 1 shows a brief configuration of a projection exposure apparatus according to the first embodiment. A light source 1 and an illumination optical system, comprising an illumination-shaping optical system 2 to a relay lens 8, irradiates light having uniform illuminance to an illumination area 21 of a reticle R. A circuit pattern on the reticle R in the illumination area 21 is transferred to a wafer W through a projection optical system 13. For the light source 1, an excimer laser light source, e.g., an $F_2$ excimer laser, an ArF excimer laser, or a KrF excimer laser, a metal vapor laser light source, a pulse light source, e.g., a YAG laser harmonic generation apparatus or the like, or a continuous light source where a mercury lamp and an elliptic reflection mirror are combined, may be used.

In a case of using a pulse light source, turning on or off the exposure is switched by controlling a power supply of a power source unit of the pulse light source. In a case of using a continuous light source, turning on or off the exposure is switched by a shutter provided in the illumination-shaping optical system 2. However, since the first embodiment comprises a movable blind (movable field stop) 7 as will be described later, turning on or off the exposure may be switched by opening or closing the blades 7A and 7B of the movable blind 7.

In FIG. 1, the light flux diameter of illumination light emitted by the light source 1 is set to a predetermined diameter by the illumination-shaping optical system 2. The light reaches a fly-eye lens 3. A plurality of secondary light sources are formed on the exiting surface of the fly-eye lens 3. Illumination light from the secondary light sources is converged by a condenser lens 4, and reaches the movable blind (movable field stop) 7 through a fixed field stop 5. In FIG. 1, although the field stop 5 is arranged on the condenser lens 4 side of the movable blind 7, it may be arranged on the other side, i.e., the relay lens 8 side.

On the field stop 5, a rectangular opening is formed. Light flux, which passes through the field stop 5, is incident upon the relay lens system 8. The relay lens system 8 is a lens system that conjugates the movable blind 7 and a pattern surface of the reticle R. The movable blind 7 is configured with two blades (light-shielding plates) 7A and 7B which define a width in Y direction, and two blades (not shown) which define a width in X direction. The blades 7A and 7B that define a width in Y direction are supported in a way that they are independently movable in the Y direction, respectively, by the driving units 6A and 6B. The two blades (not shown) that define a width in the X direction are also supported in a way that they can independently be driven. According to the first embodiment, illumination light is irradiated only to a desired exposure area, which can be set by the movable blind 7, in the illumination area 21 of the reticle R which is set by the fixed field stop 5. Note that the fixed field stop 5 may be excluded from the configuration, and the exposure apparatus may comprise only the movable blind 7.

Figure 2:
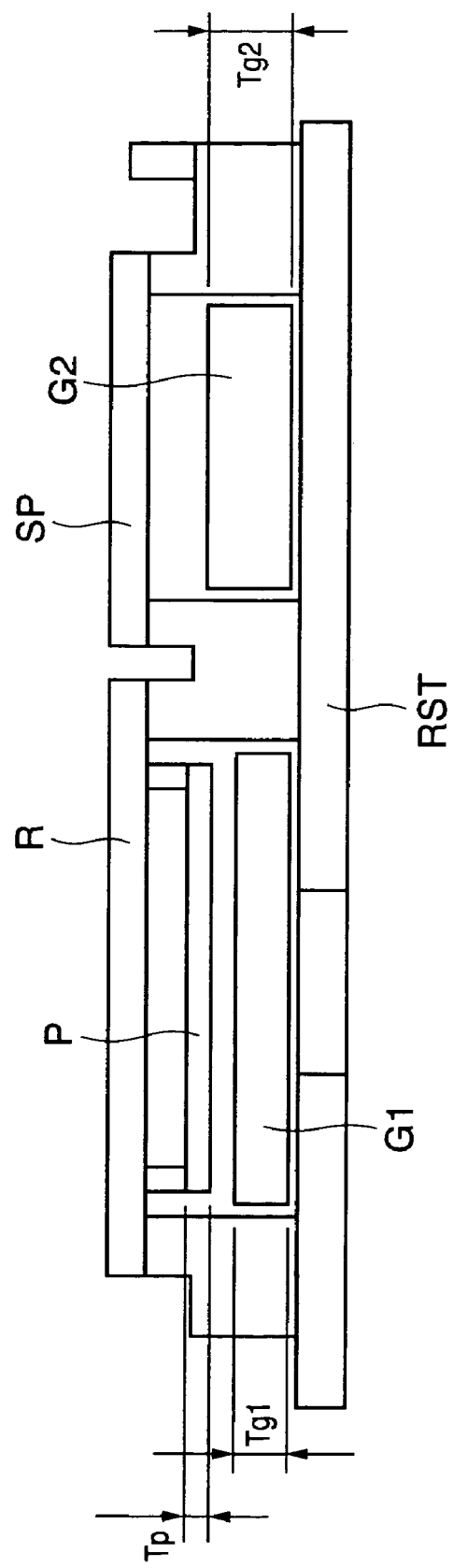
FIG. 2 is an enlarged view of a reticle stage portion shown in FIG. 1.

The reticle R, having a pellicle P on the pattern surface, is supported by a reticle stage RST (see FIG. 2). An interferometer 22 detects a position of the reticle stage RST. The reticle stage RST is driven by a reticle stage driving unit 10. On the reticle stage RST, a reticle reference plate SP is placed. Below the reticle R, an optical device G1 is provided. Below the reticle reference plate SP, a correction optical device G2 is provided. The optical device G1 mainly corrects distortion components. Above the reticle R, a TTL detection system AS (not shown) is provided. The TTL detection system AS can examine a mark on the reticle R and a mark on the reticle reference plate, as well as a mark on the wafer stage WST through the projection optical system 13.

The circuit pattern image in the illumination area 21 of the reticle R, defined by the movable blind 7, is projected and exposed to the wafer W through the projection optical system 13.

An operation of the reticle stage driving unit 10 and movable blind control unit 11 is controlled by a main control system 12 which controls an operation of the entire apparatus.

Meanwhile, the wafer W is placed on the wafer stage WST by a wafer conveyance device (not shown). The wafer stage WST is constructed with an XY stage and a Z stage. The XY stage performs positioning of the wafer W on the surface perpendicular to the optical axis of the projection optical system 13, and moves the wafer W in X or Y direction. The Z stage performs positioning of the wafer W in the Z direction. On the wafer stage WST, a reference mark FM (see FIG. 4) is provided to be used in calibration of the apparatus. The position of the wafer stage WST is detected by an interferometer 23. Above the wafer W, an off-axis alignment sensor 16 is provided. An alignment mark on the wafer is detected by the alignment sensor 16 and a control unit 17, and the detected result is transferred to the main control system 12. The main control system 12 controls the positioning and stepping operation of the wafer stage WST through a wafer stage driving unit 15. According to the above operation, the circuit pattern image on the reticle R is sequentially transferred to a shot area of the wafer W. Furthermore, a so-called base line measurement is performed by detecting the reference mark FM with the alignment sensor 16, thereby executing calibration of the apparatus.

With respect to distortion correction using the optical device G1, a correction method related to a stepper is disclosed in the aforementioned document (Japanese Patent Application Laid-Open No. 8-203805) and a correction method related to a scanning projection exposure apparatus is disclosed in the aforementioned document (Japanese Patent Application Laid-Open No. 11-045842). Therefore, detailed descriptions thereof are omitted herein.

FIG. 2 is an enlarged view of a configuration having the reticle R, pellicle P provided on the pattern surface side of the reticle R, and the optical device G1. FIG. 2 shows a case in which a synthetic quartz glass plate is used as a pellicle material. A frame, formed with metal or the like, is fixed to the reticle R with an adhesive agent. The pellicle P, formed with a synthetic quartz glass plate, is fixed to the frame with an adhesive agent. Reference Tp indicates the thickness of the glass plate, serving as the pellicle P. Reference Tg1 indicates the thickness of the optical device G1.

Figure 3:
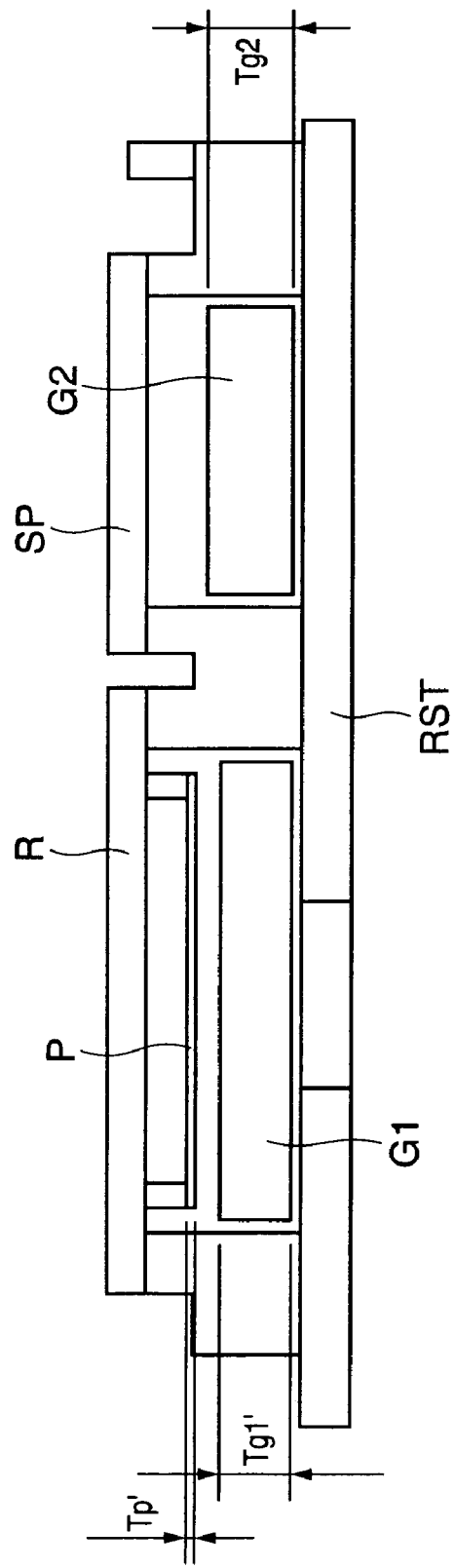
FIG. 3 is an enlarged view of a reticle stage portion shown in FIG. 1.

On the contrary, FIG. 3 shows a case in which a film material, e.g., an organic polymer, is used as a pellicle material. Although the pellicle P is film, the thickness thereof is represented by Tp' in FIG. 3 for the purpose of explanation. The thickness of the optical device G1 is represented by Tg1'. The thickness of the correction optical device G2 is represented by Tg2 both in FIGS. 2 and 3.

Take notice of the thickness of the optical members arranged in the optical path from the reticle R to the projection optical system 13. In FIG. 2, that is, in a case where a synthetic quartz glass plate is used as a pellicle material, the total thickness (T1) of the optical members is expressed as follows:

$$T1 = Tp + Tg1$$

In FIG. 3, that is, in a case where a film material, e.g., an organic polymer, is used as a pellicle material, the total thickness (T2) of the optical members is expressed as follows:

$$T2 = Tp' + Tg1'$$

Herein, the thickness Tg1 and Tg1' of the optical device G1 must be determined so as to satisfy T1=T2. By virtue of deciding the thickness Tg1 and Tg1' in this manner, a focused pattern image of the reticle R can be transferred to the wafer W through the projection optical system 13, even if the thickness of the pellicle P changes.

Figure 4:
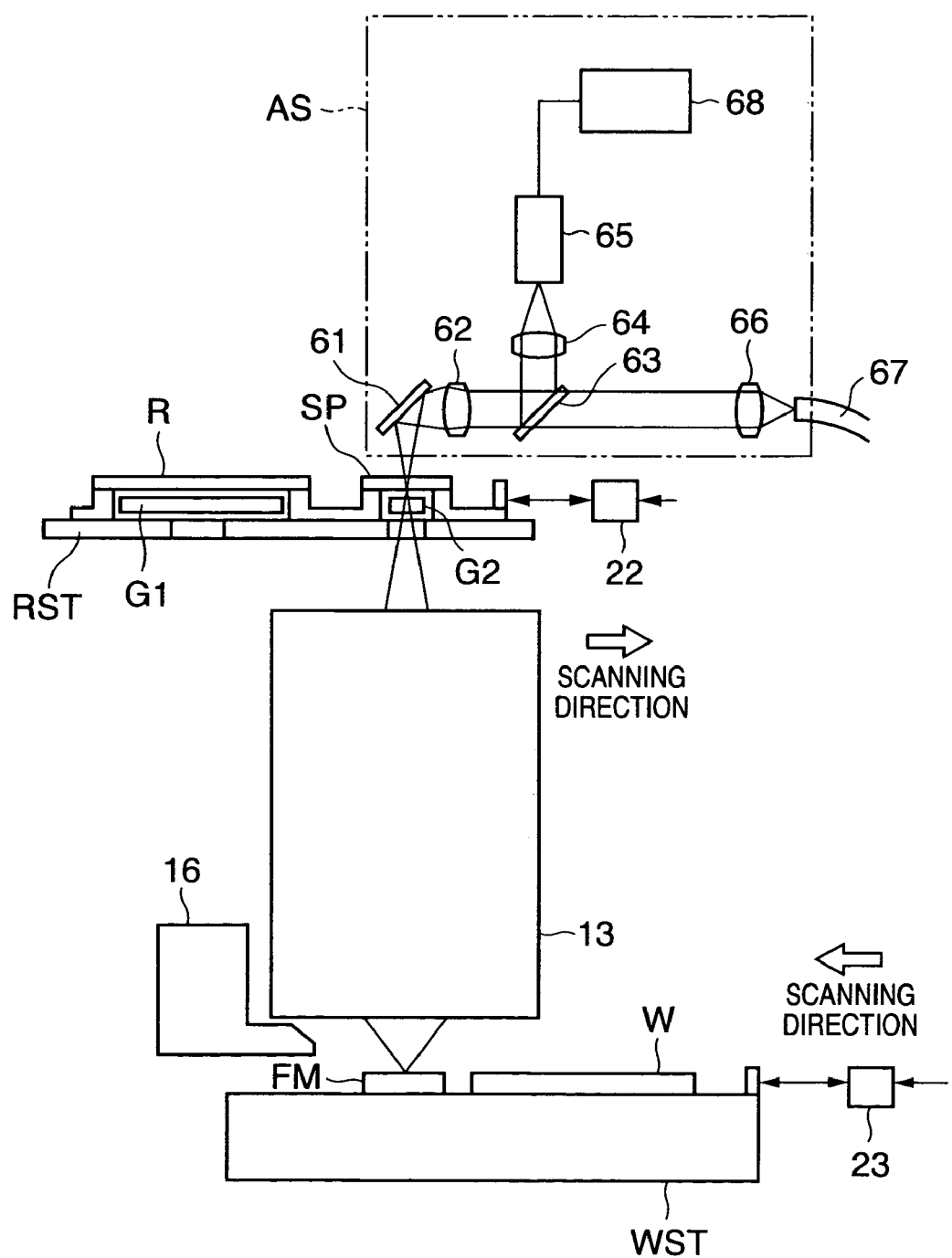
FIG. 4 is a diagram explaining a TTL detection system in the exposure apparatus shown in FIG. 1.

Next, an arrangement of the TTL detection system AS is described with reference to FIG. 4. In FIG. 4, the TTL detection system AS is arranged above the reticle R. FIG. 4 describes a case where the reticle reference plate SP is examined. For the components identical to those in FIG. 1, the same reference numerals are assigned and detailed description thereof is omitted. For the light source, the same light source as the exposure light source is employed. Illumination light branched from the illumination optical system (not shown) is directed to the detection system AS by a fiber 67. Although the light is guided by a fiber in this example, the light may be guided by an optical system. The guided illumination light irradiates a mark on the reticle reference plate SP through an optical system 66, a half mirror 63, an optical system 62, and a mirror 61. The illumination light, irradiating the mark on the reticle reference plate SP, then irradiates the reference mark FM, which is fixed to the wafer stage WST, through the correction optical device G2 and projection optical system 13. On the reference mark FM, an examination mark is arranged. The light reflected upon the examination mark is returned through the projection optical system 13, correction optical device G2, reticle reference plate SP, mirror 61, optical system 62, half mirror 63, and elector optical system 64, then an image is formed on a CCD 65.

When the mark on the reticle reference plate SP and the reference mark FM on the wafer stage are examined by the TTL detection system AS, the examination is performed through the correction optical device G2. In this case, the thickness of the correction optical device G2 must be determined so as to satisfy T1=Tg2 and T2=Tg2. By this, it is possible to examine the mark in a focused state.

By virtue of the configuration that satisfies T1=T2=Tg2, it is possible to achieve a focused state in any of the following cases: a case where pattern images of different reticles R are transferred to the wafer W, a case where a mark on the reticle reference plate SP and a mark on the reference mark FM are examined by the TTL detection system AS, a case where a mark on the reticle reference plate SP and a mark on the wafer are examined by the TTL detection system AS, or a case where a reference mark or a mark on a wafer is examined by the TTL detection system AS through the reticle or reticle reference plate.

Although the first embodiment has described a case where a pellicle P is provided for the reticle, even in a case where a pellicle is not provided, a similar effect can be attained by determining the thickness of the optical device G1 and correction optical device G2 assuming the thickness of the pellicle P being 0 (Tp=0, Tp'=0). Furthermore, although the above description has been given on the thickness of the optical members, a similar effect can also be attained by forming a same optical path length, taking the refractive index of the optical material into consideration.

As has been described above, the exposure apparatus according to the first embodiment comprises: a projection optical system (13) having a predetermined image forming characteristic; a mask stage (reticle stage RST), arranged on one side of the projection optical system, and which holds a mask substrate (reticle R) having a transfer pattern, and a reference plate (reticle reference plate SP) used for calibration of the apparatus or positioning of a wafer; and a wafer stage (WST), arranged on the other side of the projection optical system, and which has a reference mark (FM) and holds a wafer (W) on which the transfer pattern is transferred. When the transfer pattern is transferred to the wafer, the optical modulation members (optical device G1, pellicle P), which influence the optical path length from the mask substrate to the wafer, are provided between the mask substrate and the projection optical system. In other words, the mask substrate and wafer have an imaging relation and a conjugated relation through the optical modulation members (optical device G1, pellicle P) and the projection optical system. When the reference plate and reference mark are examined by the TTL detection system AS, the thickness of the correction optical device G2 is adequately selected so that the optical path length between the reference plate and the reference mark is substantially equal to the optical path length that is influenced by the optical modulation members. In other words, by making the thickness of the correction optical device G2 equal to the thickness of the optical modulation members, it is possible for the TTL detection system AS to examine the reference plate and reference mark in a focused state.

Note that the aforementioned optical modulation members are the members that influence the image forming characteristic of the projection optical system, in particular, the imaging relation and conjugated relation between the mask substrate and the wafer. By arranging such optical modulation members, the imaging relation and conjugated relation are formed. By changing or not having the optical modulation members, the imaging relation and conjugated relation are not formed. Note that the aforementioned configuration for having a substantially equal optical path length is provided to realize the above-described imaging relation and conjugated relation between the reference plate and reference mark without the help of the optical modulation members.

For instance, assume that the optical modulation members are configured with at least one of the pellicle provided for protecting the mask substrate, and the optical device (G1) provided for correcting an aberration of the projection optical system and correcting a deviation of the mask substrate from an ideal plane. To achieve the aforementioned imaging relation, the thickness of the correction optical device (G2) provided between the reference plate and the projection optical system is set equal to the total thickness of the pellicle and optical device (G1). In a case where the optical device G1, pellicle and correction optical device G2 have a different refractive index, the refractive index is taken into consideration and the thickness of the correction optical device is determined so that, when the thickness is converted to air space, it is equal to the total thickness of the pellicle and optical device.

According to the above-described construction of the first embodiment, a focused state can be achieved when a mark on the reticle reference plate which constitutes the reticle reference plate is examined, or a wafer or a reference mark on the wafer stage is examined through the reticle reference plate. Note although the first embodiment has described a configuration having one reticle reference plate, a plurality of reticle reference plates may be provided.

Furthermore, by determining a combination of pellicle and optical device so as to achieve a constant total thickness of the pellicle and optical device, it is possible to adapt to any changes in the thickness caused by using different pellicle materials. In other words, a higher flexibility is achieved with respect to the pellicle thickness. Therefore, it is possible to realize an optical device which can correct influences of the surface shape of a reticle pattern, which is a distortion factor, and a random distortion that remains in the projection optical system, and also realize a pellicle which is not easily deteriorated by a light source using lasers having a short wavelength, such as an ArF laser or $F_2$ laser. As a result, it is possible to prevent occurrence of transfer errors caused by dust or the like.

SECOND EMBODIMENT

Hereinafter, the second embodiment will be described with reference to FIGS. 5 and 6.

Figure 5:
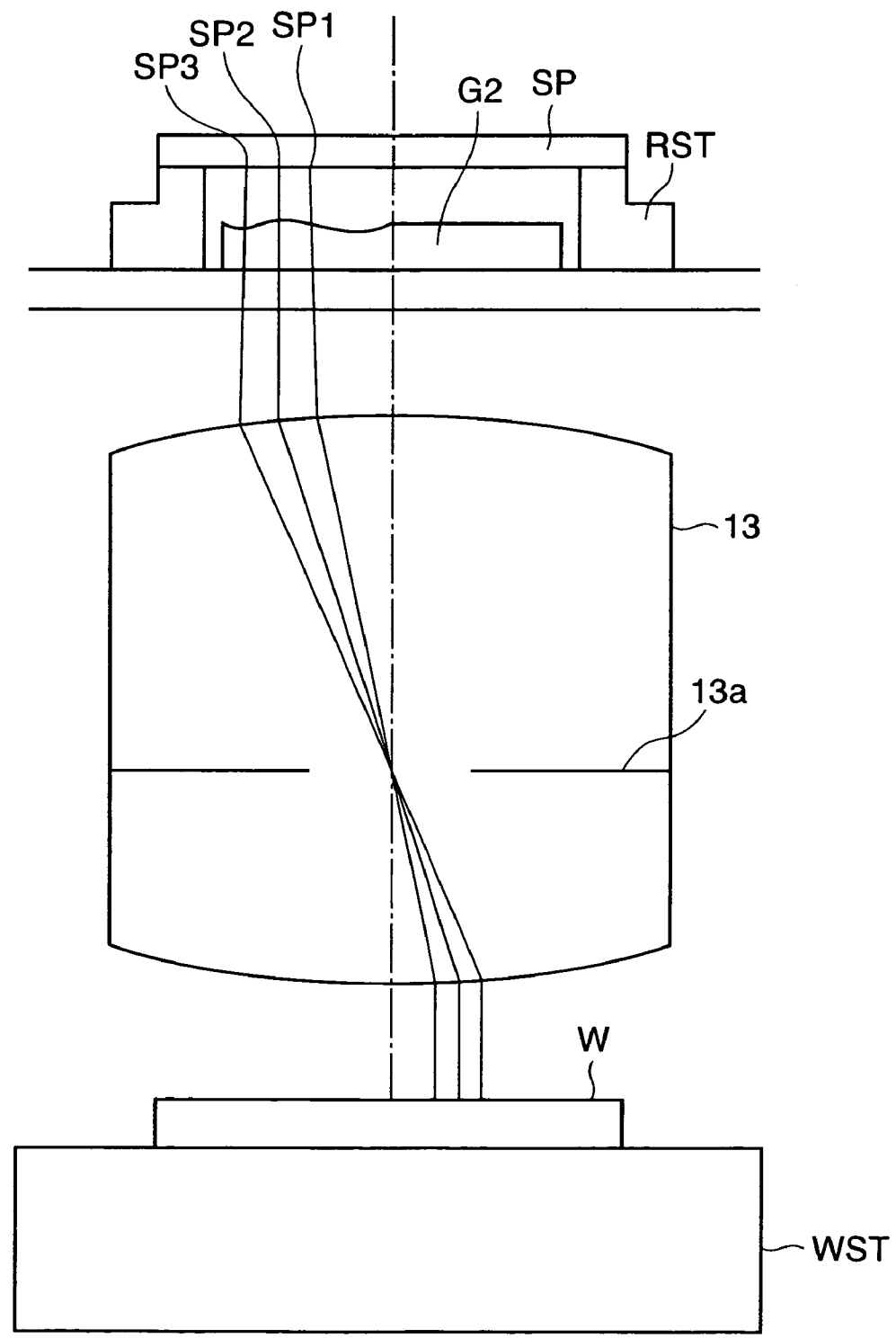
FIG. 5 is a cross-sectional view explaining an effect of a correction optical device in an exposure apparatus according to the second embodiment of the present invention.

FIG. 5 is a cross-section of an exposure apparatus seen from a direction orthogonal to the scanning direction. FIG. 5 differs from FIG. 1 in that the correction optical device G2 is processed into an aspherical shape. The portions that are identical to FIG. 1 or not used in the description of the second embodiment will not be reiterated in the following description or shown in FIG. 5.

Figure 6:
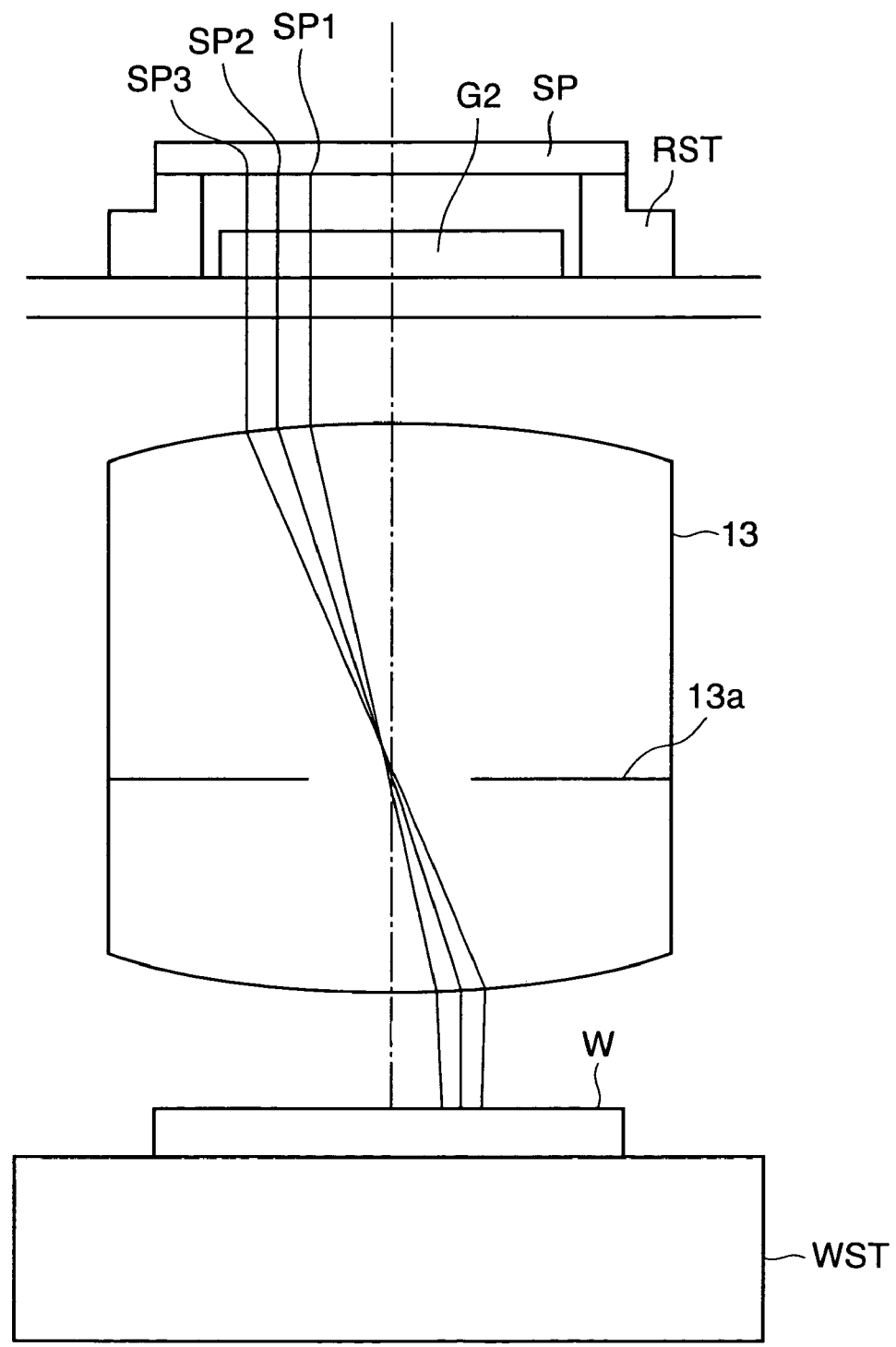
FIG. 6 is a diagram explaining paths of luminous rays in a case where the correction optical device according to the second embodiment is not employed.

FIG. 6 shows a state in which the correction optical device G2 is not processed into an aspherical shape. The drawing shows chief rays in a case where three points SP1 to SP3 on the reticle reference plate SP are examined by the TTL detection system AS. Reference numeral 13a denotes an aperture stop, which corresponds to a pupil position of the projection optical system 13. If a spherical aberration remains on the pupil of the projection optical system 13 as shown in FIG. 6, the chief ray, which should be parallel with the optical axis of the projection optical system 13, inclines for each image height on the wafer side. In this state, if a position in the focus direction is deviated on the wafer side, an examination position is also deviated on the wafer, resulting in an error in the position measurement.

In FIG. 5, when the respective chief rays for examining SP1 to SP3 are incident upon the correction optical device G2, the angle of the rays changes in accordance with the surface shape of the optical device G2. If this angle corresponds to the remaining amount of the spherical aberration on the pupil of the projection optical system 13, telecentricity is assured on the wafer side. Even if a position in the focus direction is deviated on the wafer side, the examination position will not be deviated. Therefore, an error in the position measurement can be reduced. To assure telecentricity in each image height, the surface of the correction optical device G2 is shaped into an angle corresponding to the spherical aberration of each image height. The surface may have an aspherical shape, or may be partially processed.

Although the second embodiment has described a configuration having one reticle reference plate, a plurality of reticle reference plates may be provided. In this case, the correction optical device G2 is provided in correspondence with each reference plate.

In the second embodiment, the optical device G1 is held by the reticle stage RST and scanned along with the reticle R. However, in a case where the optical device G1 is arranged in a fixed unit and is not scanned along with the reticle R, the optical device G1 is arranged on the optical path at the time of the exposure and examination of the mark on the reticle reference plate SP. To achieve the similar effect, a correction optical device G2 corresponding to the thickness of the pellicle is arranged below the reticle reference plate SP.

Furthermore, although the above-described construction has one optical device G1 and one correction optical device G2, a plurality of respective optical devices may be provided. Moreover, the projection optical system 13 may be of a dioptric system, a catoptric system, or a catadioptric system using a lens and a concave mirror.

As has been described above, according to the second embodiment, the correction optical device G2 is formed into a partially processed shape or an aspherical shape so as to correct the aberration on the pupil position of the projection optical system 13. When calibration of the apparatus is performed by using the reticle reference plate, even if a spherical aberration remains on the pupil position of the projection optical system, by virtue of the telecentricity assured in each image height on the reticle reference plate, it is possible to prevent deterioration of the position measurement precision even if a focus deviation occurs on the wafer side.

THIRD EMBODIMENT

Hereinafter, the third embodiment will be described with reference to FIGS. 7 and 8A to 8C. The configuration identical to FIGS. 1 to 6 will not be described.

In the first embodiment, the reticle reference plate SP and the reference mark FM are examined by the TTL detection system AS in a focused state by virtue of having the correction optical device G2 below the reticle reference plate SP. On the contrary, according to the third embodiment, the reticle reference plate SP is arranged at a position shifted from the pattern surface of the reticle R toward the optical axis direction of the projection optical system 13. By virtue of this arrangement, it is possible to examine the reticle reference plate SP and reference mark FM in a focused state. The shift amount of the reticle reference plate SP corresponds to the thickness of the optical device G1. The main differences between FIG. 7 and FIG. 4 are the existence/absence of the correction optical device G2, and the arranging position of the reticle reference plate SP.

Figure 7:
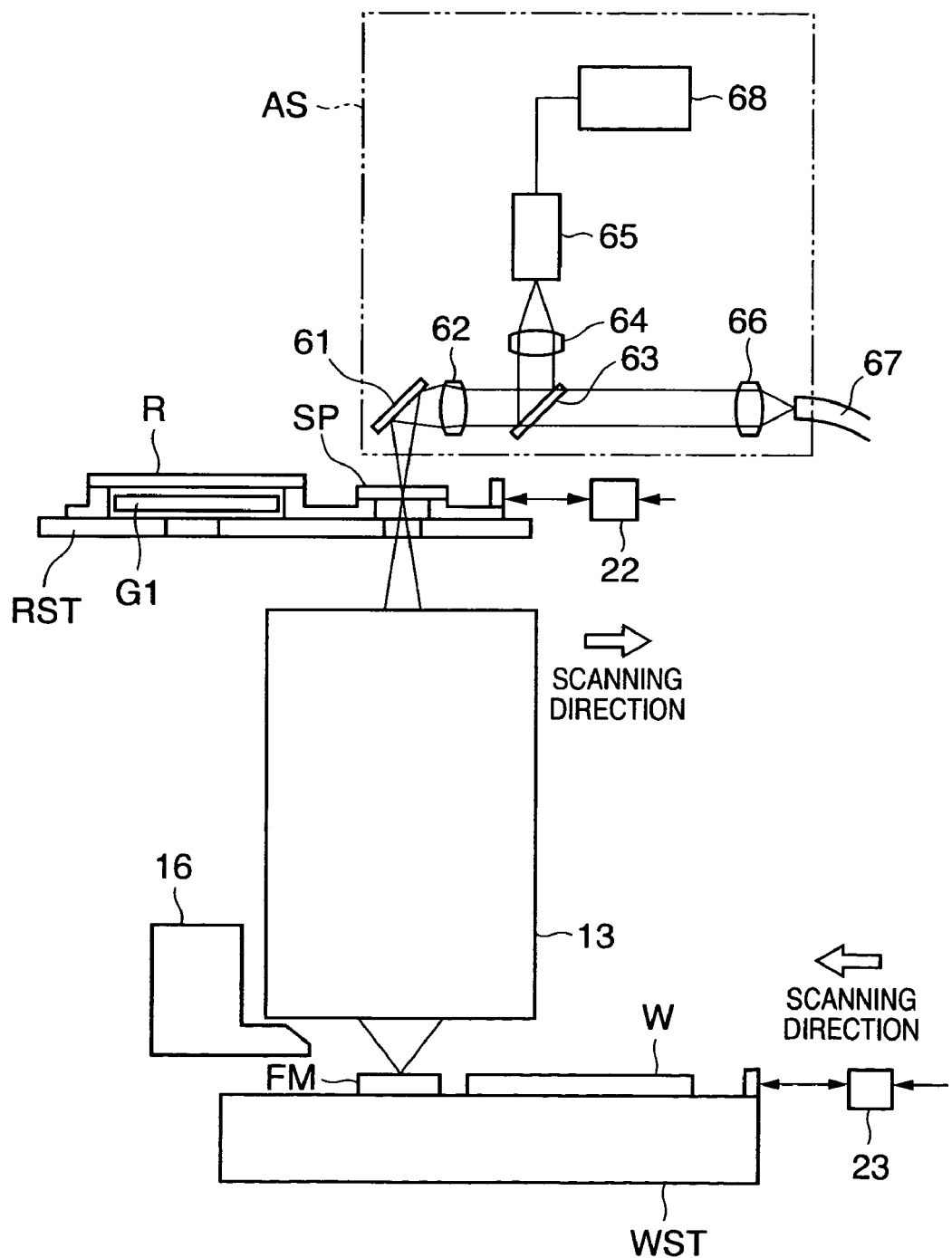
FIG. 7 is a diagram explaining an exposure apparatus according to the third embodiment of the present invention.
Figure 8A:
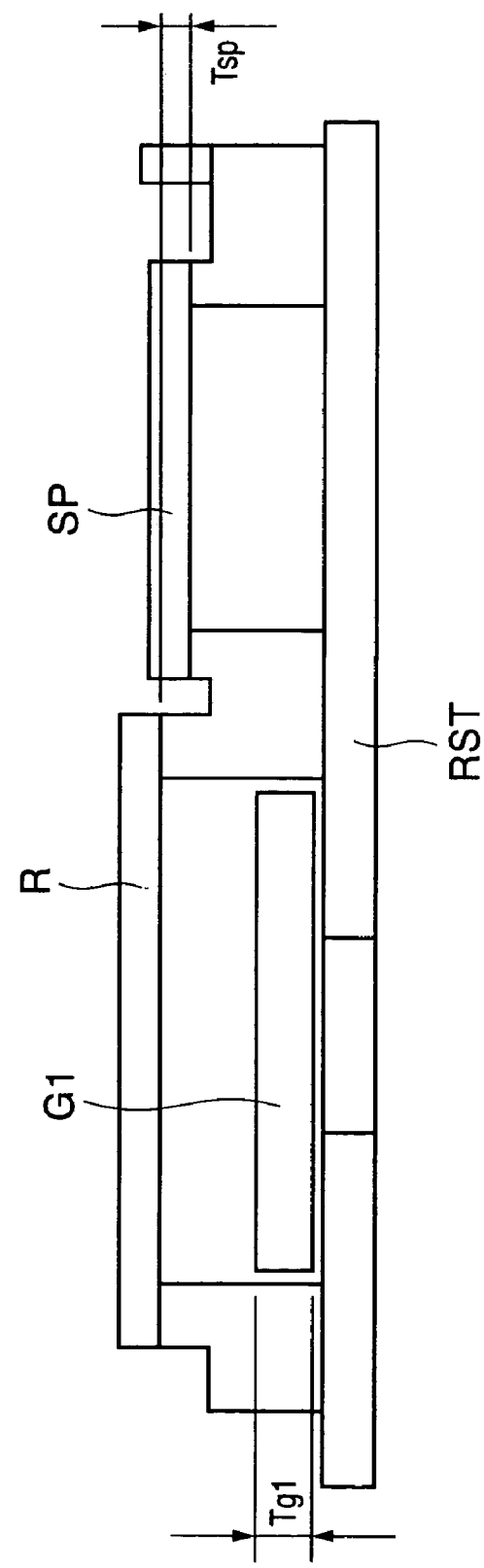
FIGS. 8A to 8C are enlarged views of a reticle stage portion shown in FIG. 3.

FIG. 8A is an enlarged view of the reticle stage RST shown in FIG. 7. Assuming that the distance between the pattern surface of the reticle R and the pattern surface of the reference plate SP is Tsp, the refractive index of the optical device G1 is Ng1, and the thickness of the optical device G1 is Tg1, Tsp is expressed as follows:

$Tsp = Tg1 \times (1 - 1/Ng1)$

The distance is equal to the difference between the object surface of the projection optical system 13 in a case where the optical device G1 is arranged, and the object surface of the projection optical system 13 in a case where the optical device G1 is not arranged. In the foregoing manner, by arranging the pattern surface of the reference plate SP at a position shifted from the pattern surface of the reticle R by a distance Tsp toward the projection optical system 13, it is possible to maintain the same image forming position on the wafer stage WST regardless of existence/absence of the optical device G1.

Figure 8B:
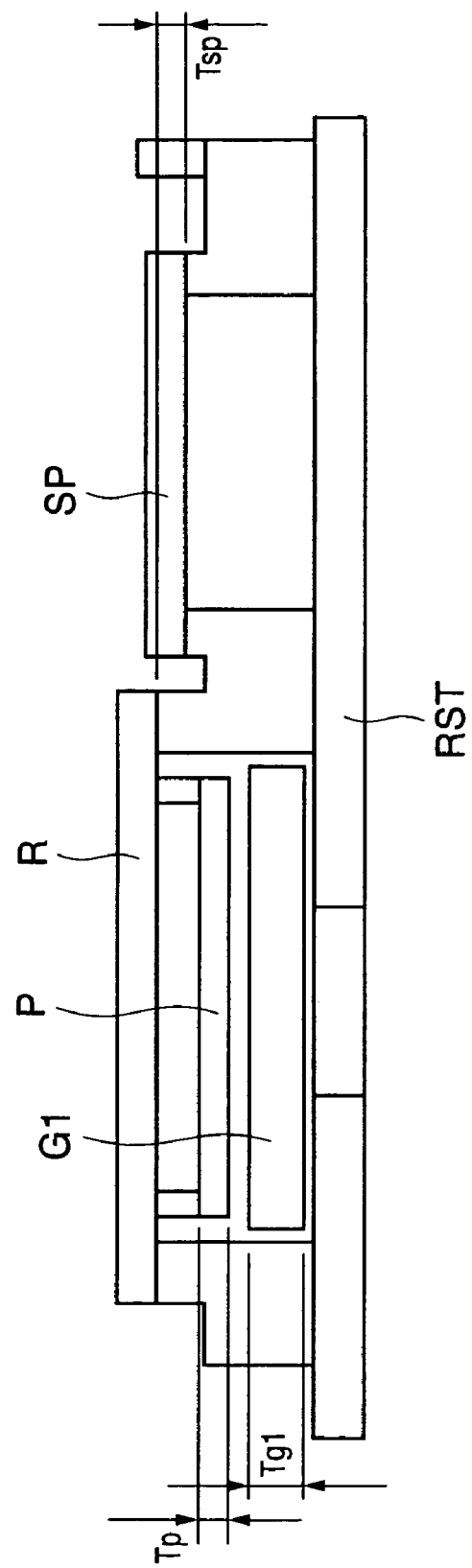
Figure 8C:
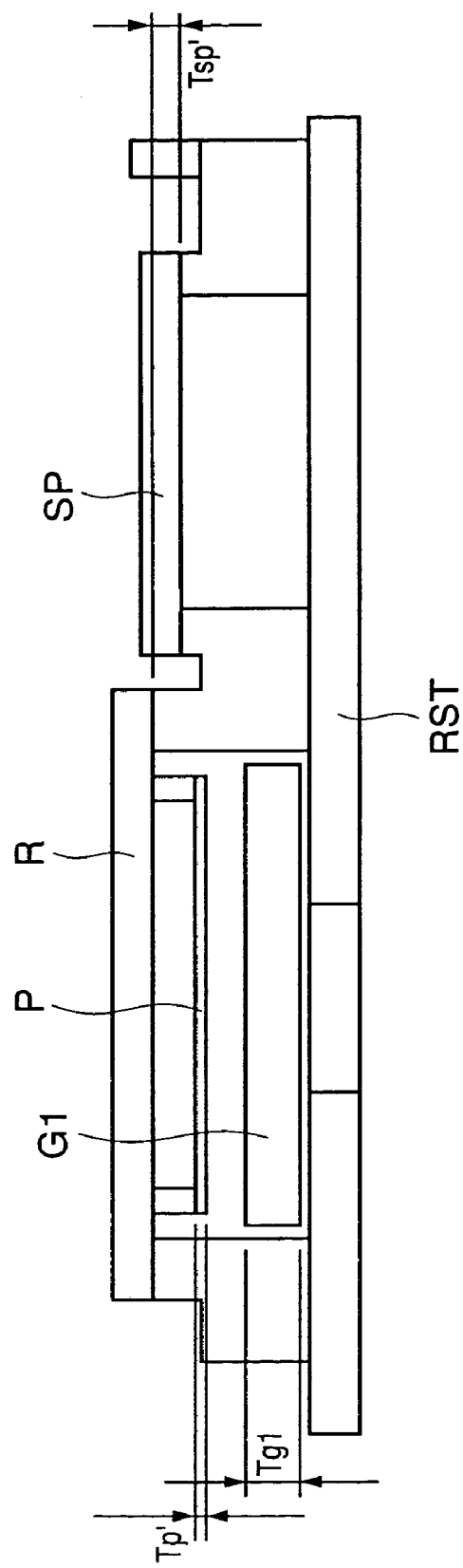

FIGS. 8B and 8C show a case where a pellicle is formed as in FIGS. 2 and 3. Referring to FIG. 8B, assuming that the thickness of the pellicle P is Tp and the refractive index is Np, Tsp is expressed as follows:

$Tsp = Tp \times (1 - 1/Np) + Tg1 \times (1 - 1/Ng1)$

Similarly, in FIG. 8C, assuming that the thickness of the pellicle P is Tp' and the refractive index is Np, Tsp' is expressed as follows:

$Tsp' = Tp' \times (1 - 1/Np) + Tg1 \times (1 - 1/Ng1)$

In FIGS. 8B and 8C, in a case where only the pellicle P is provided, or a case where the optical device G1 is not held by the reticle stage RST and is fixedly arranged, the distance Tsp or Tsp' is expressed as follows taking only the thickness of the pellicle P into consideration:

$Tsp = Tp \times (1 - 1/Np)$ $Tsp' = Tp' \times (1 - 1/Np)$

As described above, according to the third embodiment, as means for equalizing the optical path length (to have an equal imaging relation and conjugated relation), a predetermined difference is provided between the surface position of the mask substrate (reticle R) that faces the projection optical system (13) and the surface position of the reference plate (SP) that faces the projection optical system, in the optical axis direction (a predetermined difference is provided toward the optical axis direction of the projection optical system). More specifically, when the optical modulation members are configured with at least one of the pellicle provided for mask substrate protection, the optical device for correcting an aberration of the projection optical system, and the optical device for correcting a deviation of the mask substrate from an ideal plane, the aforementioned predetermined difference Tsp is expressed as follows:

$Tsp = Tp \times (1 - 1/Np) + Tg \times (1 - 1/Ng)$ where the thickness of the pellicle is Tp, the refractive index is Np, the thickness of the optical device is Tg, and the refractive index is Ng (if the pellicle does not exist, Tp=0, and if the optical device does not exist, Tg=0).

According to the configuration of the third embodiment, the correction optical device is unnecessary. Therefore, the structure of the exposure apparatus can be simplified.

FOURTH EMBODIMENT

Hereinafter, the fourth embodiment will be described with reference to FIGS. 9 and 10. The configuration identical to FIGS. 1 to 8 will not be described.

In the third embodiment, the reticle reference plate SP and the reference mark FM are examined by the TTL detection system AS in a focused state by virtue of arranging the reticle reference plate SP at a shifted position. On the contrary, according to the fourth embodiment, the reticle reference plate SP is arranged on the substantially same level as the pattern surface of the reticle R. However, the stroke of the wafer stage WST in the optical axis direction of the projection optical system 13 is enlarged from the conventional stroke so that the wafer stage comes close to the projection optical system 13. By virtue of this arrangement, it is possible to examine the reticle reference plate SP and reference mark FM in a focused state. The position of the wafer stage WST at this stage corresponds to the thickness of the optical device G1.

Figure 9:
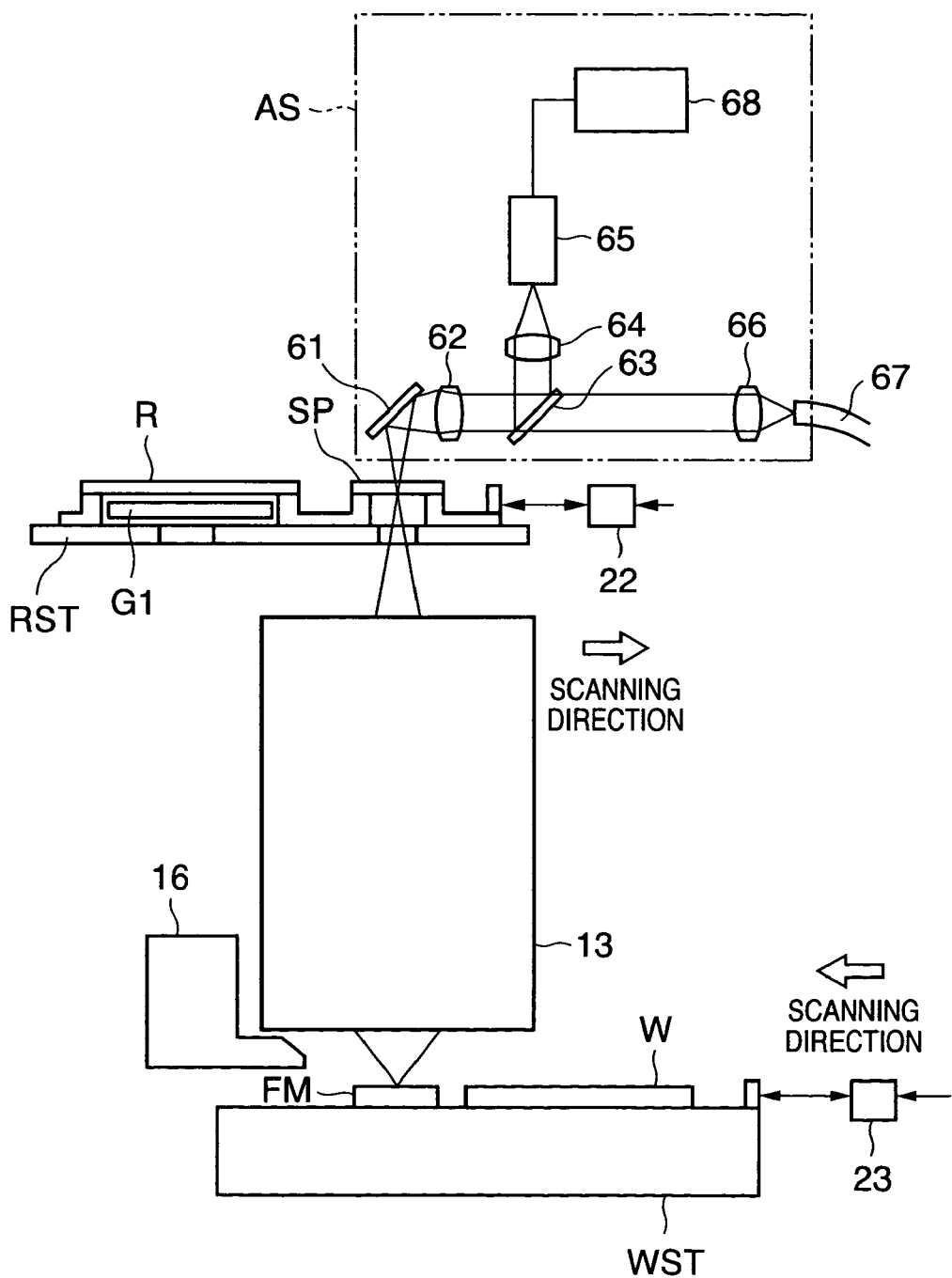
FIG. 9 is a diagram explaining an exposure apparatus according to the fourth embodiment of the present invention.
Figure 10:
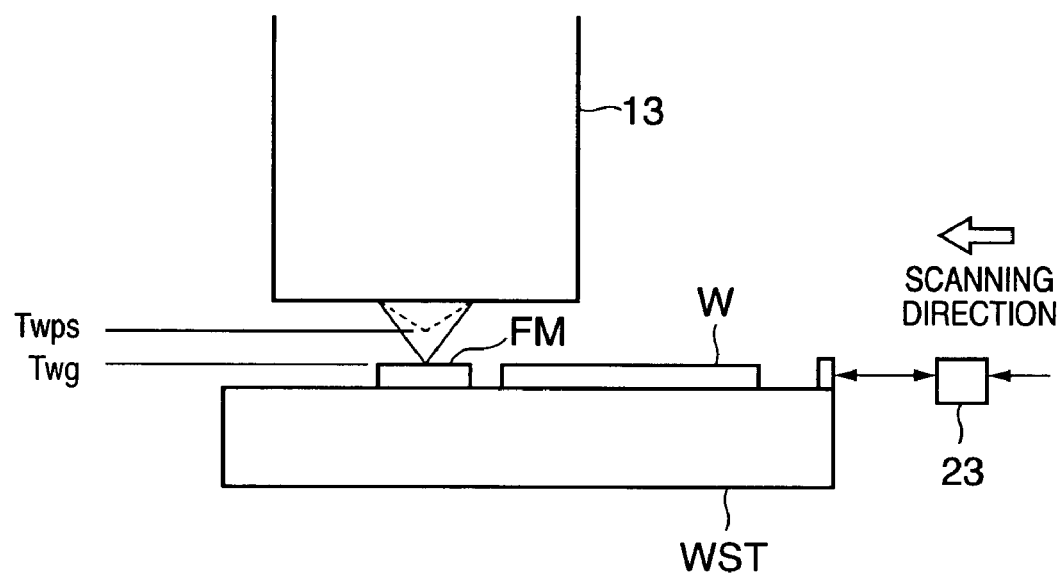
FIG. 10 is an enlarged view of a wafer stage portion in the exposure apparatus shown in FIG. 9.

The main difference between FIG. 7 and FIG. 9 is the arranging position of the reticle reference plate SP. The main difference between FIG. 4 and FIG. 9 is the existence/absence of the correction optical device G2. FIG. 10 is an enlarged view of the wafer stage WST. Assuming that the image forming position through the optical device G1 and projection optical system 13 is Twg, the image forming position through the reticle reference plate SP and projection optical system 13 is Twps, and an image forming magnification of the projection optical system 13 is β, the positional difference Twps−Twg of the reference mark FM with respect to the optical axis direction of the projection optical system is expressed as follows:

$$Twps-Twg=(Tg1\times(1-1/Ng1))/\beta^2$$

By driving the wafer stage WST in the optical axis direction of the projection optical system 13 to move the reference mark FM to the position Twps, it is possible for the TTL detection system AS to examine the reticle reference plate SP and the reference mark FM in a focused state.

In a case where a pellicle is formed as in FIGS. 2 and 3, assuming that the thickness of the pellicle P is Tp and Tp', respectively, and the refractive index is Np, the positional difference Twps−Twg of the reference mark FM with respect to the optical axis direction of the projection optical system is expressed respectively as follows:

$$Twps-Twg=(Tp\times(1-1/Np))/\beta^2+(Tg1\times(1-1/Ng1))/\beta^2$$

$$Twps-Twg=(Tp'\times(1-1/Np))/\beta^2+(Tg1'\times(1-1/Ng1))/\beta^2$$

Furthermore, in a case where only the pellicle P is provided, or a case where the optical device G1 is not held by the reticle stage RST and is fixedly arranged, in other words, in a case where the TTL detection system AS examines the reference mark FM through the reticle reference plate SP, optical device G1, and projection optical system 13, the positional difference is expressed as follows taking only the thickness (Tp, Tp') of the pellicle P into consideration:

$$Twps-Twg=(Tp\times(1-1/Np))/\beta^2$$

$$Twps-Twg=(Tp'\times(1-1/Np))/\beta^2$$

Similarly to the first and second embodiments, although the third and fourth embodiments have described a configuration having one reticle reference plate, a plurality of reticle reference plates may be provided.

Furthermore, although the above-described construction has one optical device G1, a plurality of optical devices may be provided. Moreover, the projection optical system 13 may be of a dioptric system, a catoptric system, a catadioptric system, or a catadioptric system using a lens and a concave mirror.

As described above, according to the fourth embodiment, as means for equalizing the optical path length (to have an equal imaging relation and conjugated relation), a predetermined difference is provided between the surface position of the wafer that faces the projection optical system (13) and the surface position (position in the optical axis direction of the projection optical system) of the reference mark (FM) that faces the projection optical system, in the optical axis direction. For instance, such predetermined difference may be generated by driving the wafer stage (WST) in the optical axis direction when examining the reference plate and reference mark by the TTL detection system AS or examining the reference mark through the reference plate (when performing apparatus calibration). Alternatively, the reference mark (FM) may be set at a different height from the height of the wafer surface.

More specifically, when the optical modulation members are configured with at least one of the pellicle provided for mask substrate protection, the optical device for correcting an aberration of the projection optical system, and the optical device for correcting a deviation of the mask substrate from an ideal plane, the aforementioned predetermined difference (Twps−Twg) is expressed as follows:

$$Twps-Twg=Tp\times(1-1/Np)/\beta^2+Tg\times(1-1/Ng)/\beta^2$$

where the thickness of the pellicle is Tp, the refractive index is Np, the thickness of the optical device is Tg, the refractive index is Ng, and the image forming magnification of the projection optical system 13 is β (if the pellicle does not exist, Tp=0, and if the optical device does not exist, Tg=0).

According to the configuration of the fourth embodiment, the correction optical device is unnecessary. Therefore, the structure of the exposure apparatus can be simplified.

As set forth above, according to the above-described embodiments, it is possible to realize an optical device which can correct influences of the surface shape of a reticle pattern, which is a distortion factor, and a random distortion that remains in the projection optical system, and also realize a pellicle which is not easily deteriorated by a light source using lasers having a short wavelength, such as an ArF laser or $F_2$ laser. As a result, it is possible to prevent occurrence of transfer errors caused by dust or the like.

Furthermore, it is possible to adapt to any changes in the thickness of a pellicle caused by using different pellicle materials. Also, a focused state can be achieved when a mark on the reticle reference plate which constitutes the reticle reference plate is examined, or a wafer or a reference mark on the wafer stage is examined through the reticle reference plate.

Still further, when calibration of the apparatus is performed by using the reticle reference plate, even if a spherical aberration remains on the pupil of the projection optical system, by virtue of the telecentricity assured in each image height on the reticle reference plate, it is possible to prevent deterioration of the position measurement precision even if a focus deviation occurs on the wafer side.

As described above, according to the present invention, it is possible to realize an optical device which can correct influences of the surface shape of a reticle pattern, which is a distortion factor, and a random distortion that remains in the projection optical system, and also realize a pellicle which is not easily deteriorated by a light source using lasers having a short wavelength, such as an ArF laser or $F_2$ laser.

As many apparently widely different embodiments of the present invention can be made without departing from the spirit and scope thereof, it is to be understood that the invention is not limited to the specific embodiments thereof except as defined in the claims.

What is claimed is:

1. An apparatus comprising:
   a projection optical system;
   a mask stage, arranged on one side of said projection optical system, to hold a mask substrate, said mask stage having a reference plate;
   a wafer stage, arranged on the other side of said projection optical system, to hold a wafer, said wafer stage having a reference mark; and
   an adjusting unit to match an image forming relation between said reference plate and said reference mark through said projection optical system to an image forming relation between the mask substrate and the wafer through said projection optical system and an optical modulation member to influence an image forming relation between the mask substrate and the wafer through said projection optical system.

2. An apparatus according to claim 1, wherein the optical modulation member is configured with at least one of a first optical element, comprised in said apparatus, for correcting an aberration of said projection optical system, and a pellicle for protecting the mask substrate,
   wherein said adjusting unit is a second optical element arranged between said reference plate and said projection optical system, and
   wherein said second optical element has an optical path length equal to a total optical path length of the at least one of said first optical element and the pellicle.

3. An apparatus according to claim 2, wherein in the optical modulation member, a combination of the pellicle and said first optical element is determined so that the total optical path length of the pellicle and said first optical element is constant.

4. An apparatus according to claim 2, wherein said second optical element is formed into a partially processed shape or an aspherical shape so as to correct an aberration at a pupil position of said projection optical system.

5. An apparatus according to claim 1, wherein said adjusting unit has a structure that provides a predetermined difference between a pattern surface position of the mask substrate that faces said projection optical system and a surface position of said reference plate that faces said projection optical system, in an optical axis direction of said projection optical system.

6. An apparatus according to claim 5, wherein the optical modulation member is configured with at least one of a first optical element, in said apparatus, for correcting an aberration of said projection optical system, and a pellicle for protecting the mask substrate,
   wherein the predetermined difference Tsp is expressed by $$Tsp=Tp\times(1-1/Np)+Tg\times(1-1/Ng)$$

where Tp represents a thickness of the pellicle, Np represents a refractive index of the pellicle, Tg represents a thickness of said first optical element, and Ng represents a refractive index of said first optical element.

7. An apparatus according to claim 1, wherein said adjusting unit has a structure that provides a predetermined difference between a wafer surface position that faces said projection optical system and a surface position of said reference mark that faces said projection optical system, in an optical axis direction of said projection optical system.

8. An apparatus according to claim 7, wherein the predetermined difference is provided by driving said wafer stage in the optical axis direction.

9. An apparatus according to claim 8, wherein the optical modulation member is configured with at least one of a first optical element, in said apparatus, for correcting an aberration of said projection optical system, and a pellicle for protecting the mask substrate,
   wherein the predetermined difference Twp is expressed by $$Twp=Tp\times(1-1/Np)/\beta^2+Tg\times(1-1/Ng)/\beta^2$$

where Tp represents a thickness of the pellicle, Np represents a refractive index of the pellicle, Tg represents a thickness of said first optical element, Ng represents a refractive index of said first optical element, and $\beta$ represents an image forming magnification of said projection optical system.

10. An apparatus according to claim 1, wherein said apparatus is a scanning projection exposure apparatus.

* * * * *